(12) United States Patent
Rondena et al.

(10) Patent No.: US 9,248,402 B2
(45) Date of Patent: Feb. 2, 2016

(54) METHOD FOR MANUFACTURING A COMPOSITE SORBER FOR THE REMOVAL OF $H_2O$ CONSISTING OF HYGROSCOPIC INORGANIC SALTS DISSOLVED IN A POLYMERIC MATRIX

(71) Applicant: SAES GETTERS S.P.A., Lainate (IT)

(72) Inventors: Sergio Rondena, Magenta (IT); Lorena Cattaneo, Busto Arsizio (IT); Johnny Mio Bertolo, Fiume Veneto (IT); Tania Collina, Casteldilama (IT); Roberto Giannantonio, Oleggio (IT)

(73) Assignee: SAES GETTERS S.P.A., Lainate (MI) (IT)

( * ) Notice: Subject to any disclaimer, the term of this patent is extended or adjusted under 35 U.S.C. 154(b) by 0 days.

(21) Appl. No.: 14/446,212

(22) Filed: Jul. 29, 2014

(65) Prior Publication Data

US 2014/0338530 A1    Nov. 20, 2014

Related U.S. Application Data

(63) Continuation of application No. 12/738,074, filed as application No. PCT/EP2008/064590 on Oct. 28, 2008.

(30) Foreign Application Priority Data

Oct. 30, 2007   (IT) .............................. MI2007A2087

(51) Int. Cl.
| | |
|---|---|
| *B01J 20/04* | (2006.01) |
| *B01J 20/26* | (2006.01) |
| *B01D 53/28* | (2006.01) |
| *C08K 3/24* | (2006.01) |
| *B01D 53/26* | (2006.01) |
| *H01L 51/52* | (2006.01) |
| *H01M 10/052* | (2010.01) |

(52) U.S. Cl.
CPC .............. *B01D 53/28* (2013.01); *B01D 53/261* (2013.01); *C08K 3/24* (2013.01); *B01D 2253/10* (2013.01); *B01D 2253/1124* (2013.01); *H01L 51/5237* (2013.01); *H01M 10/052* (2013.01)

(58) Field of Classification Search
CPC ................................ B01J 20/26; B01J 20/046
USPC ........................................................ 252/194
See application file for complete search history.

(56) References Cited

U.S. PATENT DOCUMENTS

| | | | |
|---|---|---|---|
| 5,460,660 A * | 10/1995 | Albright et al. ............... | 136/251 |
| 6,740,145 B2 | 5/2004 | Boroson et al. | |
| 7,285,334 B1 * | 10/2007 | Yamashita et al. ............ | 428/458 |
| 2006/0097633 A1 | 5/2006 | Cho et al. | |
| 2008/0153371 A1 | 6/2008 | Losch et al. | |

FOREIGN PATENT DOCUMENTS

| | | |
|---|---|---|
| EP | 1288251 | 3/2003 |
| JP | 2006/134888 | 5/2006 |
| WO | 2004/072604 | 8/2004 |
| WO | 2006/106096 | 10/2006 |
| WO | 2007/013118 | 2/2007 |
| WO | 2007/013119 | 2/2007 |
| WO | 2007/023085 | 3/2007 |
| WO | 2007/074494 | 7/2007 |

OTHER PUBLICATIONS

Communication pursuant to Article 94(3) EPC mailed on Nov. 17, 2010 for EP Application No. 08843669.6 filed on May 24, 2010 in the name of Saes Getters S.P.A.
Communication under Rule 71(3) EPC mailed on May 12, 2014 for EP Application No. 08843669.6 filed on May 24, 2010 in the name of Saes Getters S.P.A.
International Search Report mailed on Jun. 26, 2009 for International Application No. PCT/EP2008/064590 filed Oct. 28, 2008 in the name of Saes Getters S.P.A.
Written Opinion mailed on Jun. 26, 2009 for International Application No. PCT/EP2008/064590 filed on Oct. 28, 2008 in the name of Saes Getters S.P.A.
International Preliminary Report on Patentability completed on Nov. 26, 2009 for International Application No. PCT/EP2008/064590 filed on Oct. 28, 2008 in the name of Saes Getters S.P.A.
Vondrak, J. et al. "Ion-conductive polymethylmethacrylate gel electrolytes for lithium batteries." Journal of Power Sources, vol. 146 (1-2), pp. 436-440. Aug. 26, 2005 (e-pub date: Aug. 27, 2005).
Office Action issued in Chinese Application No. 200880114034.6, mailed on Nov. 24, 2011 (with English Translation).
Office Action issued in Chinese Application No. 200880114034.6, mailed on Jun. 13, 2012 (with English Translation).
Office Action issued in Japanese Application No. 2010-531510, mailed on Nov. 6, 2012 (with English Translation).
Office Action issued in Russian Application No. 2010-121823, mailed on Jun. 15, 2012 (with English Translation).
Office Action issued in Singaporean Application No. 201002585-6, mailed on Jul. 11, 2011.
Office Action issued in Singaporean Application No. 201002585-6, mailed on Jan. 12, 2012.
Restriction Requirement mailed on May 31, 2013 for U.S. Appl. No. 12/738,074, filed Aug. 18, 2010, Sergio Rondena et al.
Non-Final Office Action mailed on Sep. 11, 2013 for U.S. Appl. No. 12/738,074, filed Aug. 18, 2010, Sergio Rondena et al.
Final Office Action mailed on Apr. 29, 2014 for U.S. Appl. No. 12/738,074, filed Aug. 18, 2010, Sergio Rondena et al.
Brabec, et al., Ch. 5 "Semiconductor Aspects of Organic Bulk Heterojunction Solar Cells", *Organic Photovoltaics*, 2003 edition, pp. 159-248, by Springer-Verlag.

(Continued)

*Primary Examiner* — Peter F Godenschwager
(74) *Attorney, Agent, or Firm* — Steinfl & Bruno LLP

(57) ABSTRACT

The present invention relates to a method for manufacturing $H_2O$ composite sorbers consisting of a polymeric matrix in which hygroscopic inorganic salts are dissolved, to composite sorbers consisting of hygroscopic inorganic salts dissolved in a polymeric matrix and their use for the removal of $H_2O$ from the housing of devices sensitive to the presence of $H_2O$.

13 Claims, 4 Drawing Sheets

(56) References Cited

OTHER PUBLICATIONS

Lim, S.F., et al., "Correlation between dark spot growth and pinhole size in organic light-emitting diodes", Applied Physics Letters, vol. 78, No. 15, Apr. 9, 2001, pp. 2116-2118.

Advisory Action mailed on Sep. 26, 2014 for U.S. Appl. No. 12/738,074, filed Aug. 18, 2010, Saes Getters S.P.A.

Non-Final Office Action mailed on Dec. 10, 2014 for U.S. Appl. No. 12/738,074, filed Aug. 18, 2010, Saes Getters S.P.A.

* cited by examiner

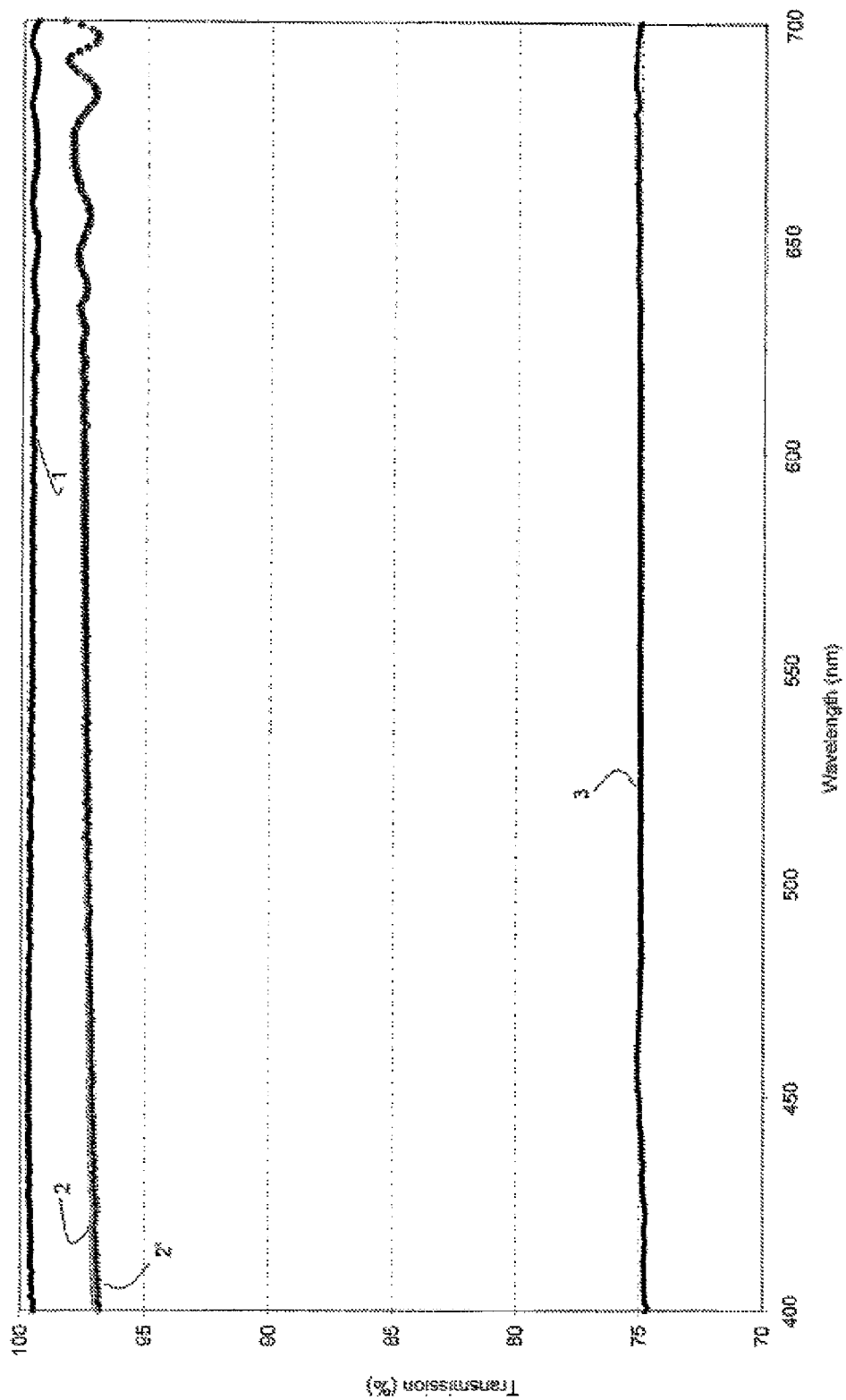

METHOD FOR MANUFACTURING A COMPOSITE SORBER FOR THE REMOVAL OF H₂O CONSISTING OF HYGROSCOPIC INORGANIC SALTS DISSOLVED IN A POLYMERIC MATRIX

CROSS REFERENCE TO RELATED APPLICATIONS

The present application is a U.S. Continuation Application of U.S. patent application Ser. No. 12/738,074 filed on Aug. 18, 2010, which is herein incorporated by reference in its entirety, which in turn, is the U.S. National Stage of International Application PCT/EP2008/064590 filed on Oct. 28, 2008 which, in turn, claims priority to Italian Application No. MI2007A002087, filed on Oct. 30, 2007.

The presence of $H_2O$, even at trace levels, results to be harmful for the correct functioning of various devices, among which lithium batteries, microelectromechanical devices known in the field by the acronym MEMS (MicroElectroMechanichal Systems), organic displays of the OLED-type (Organic Light Emitting Diode) and photovoltaic cells, i.e. the cells of the OSC-type (Organic Solar Cells), to mention some of the most interesting devices. In the following these devices, and more in general any sealed device in which the presence of $H_2O$ results to be harmful, even at low levels (lower than 5000 ppm), are referred to by the term of sensitive device.

In the sensitive devices the presence of $H_2O$ can cause the progressive deterioration of the performances; as an example, further information with respect to the effects of this contaminant can be found in the article "Correlation between dark spot growth and pinhole size in organic light-emitting diodes", by Shuang Fang Lim, et al., published in Applied Physics Letters, volume 78 no. 15, on 9 Apr. 2001 as relating to the OLED displays, and in the fifth chapter of the book "Organic Photovoltaics—Concepts and Realization" by Brabec et al., edition of 2003 by Springer-Verlag, as relating to the photovoltaic cells of the OSC-type.

The use of sorbers for the removal of gaseous impurities from the housings of devices sensitive to their presence is known in the art. For example the international patent application WO 2004/072604 in the name of the applicant discloses the use of active components dispersed in suitable porous matrices; the patent applications WO 2007/013118 and WO 2007/013119, both in the name of the applicant, instead describe nanostructured systems in which the active component is confined in a porous medium, itself being dispersed in a polymeric matrix, whereas the use of functionalized nuclei dispersed in a permeable polymeric matrix is described in the international patent application WO 2007/074494 in the name of applicant.

All of the foregoing technological solutions, although being effective with respect to the problem of $H_2O$ removal, rely on complex techniques and methodologies for carrying out them.

Other simpler technological solutions rely on a dispersion of active elements in polymers, in which the dimensions of the particles are utilized to obtain secondary properties, as the transparency, of the sorber produced in this way.

This type of solution is described in the patent U.S. Pat. No. 6,740,145, where it is requested that the dimensions of the particles of the dispersed active element are between 1 and 100 nm, and in the patent application US 2006/0097633 where a average particle size in the polymeric film of less then 100 nm with a specific size distribution is requested.

The patent application MI2007/A000690, in the name of the applicant and not yet published on the filing date of present application, shows the use of nanostructured fibres having inside an active component in form of dispersed particles.

The solutions shown in these documents have mainly two disadvantages, one inherent to the production and the other to the characteristics of the product. As relating to the disadvantage inherent to the production, this is associated to the use of particles of the active medium with a well defined particle size that requires also special precautions for their handling in case in which said particles have a very small diameter, i.e. 100 nm or less.

From the point of view of the efficiency of secondary characteristics of the product, i.e. not directly correlated to its $H_2O$ sorbing capacity, as for example the transparency, the use of an active element in form of particles dispersed in a polymeric matrix can cause the deterioration in the course of time, mainly due to problems of particle aggregation inside the dispersion medium. This problem is increasingly relevant, the larger the particles sizes of the active medium are; the importance and criticality of the particle size of the hygroscopic material are pointed out several times in the description of the above-mentioned patent U.S. Pat. No. 6,740,145. Object of the present invention is thus to overcome the inconveniences still present in the prior art as relating to the manufacturing of a $H_2O$ sorber containing a hygroscopic inorganic salt, with special reference to the necessity to use inorganic salts of nanometric dimensions in which the particle size is of fundamental importance for the characteristics and properties of the produced sorber. In a first aspect thereof, the invention consists in a method for the manufacturing of a sorber for the removal of $H_2O$ comprising a polymeric matrix and a hygroscopic inorganic salt, characterised in that said hygroscopic inorganic salt is dissolved inside of said polymeric matrix. In the following the term composite material will be used to identify the sorber material in order to highlight that is obtained dissolving an inorganic compound in a polymerized organic mixture, even if it is actually an homogeneous material that is not characterized by phase separation.

The invention will be illustrated in the following with reference to the drawings, in which:

FIG. 4 show the comparison of the transparency of different composite polymeric films.

Figure 1:
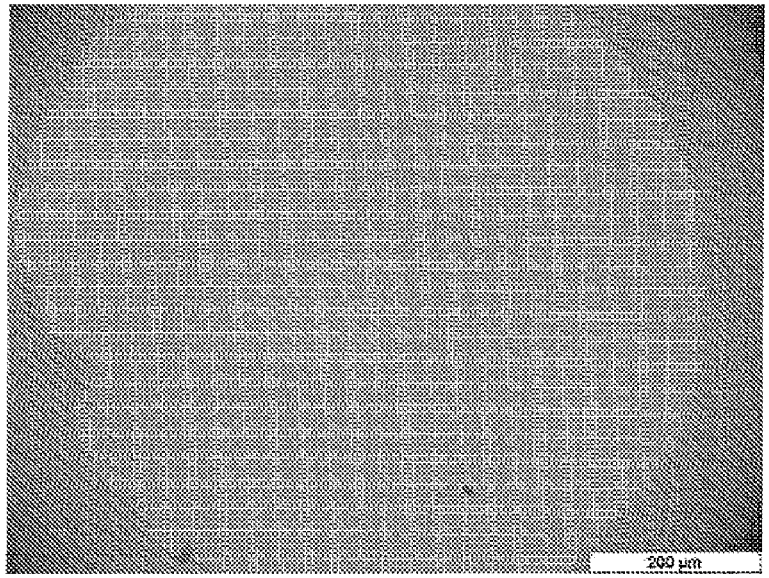
FIG. 1 shows a photography taken by an optical microscope of a composite sorber made according to the present invention.

Differently from the solutions of the prior art, for the manufacturing of the invention it is also possible to use powders with a particle size larger than 5 µm, and even, as will be illustrated in the following, also with a particle size larger than 2 mm; this simplifies their storage and handling, other than providing advantages in the manufacturing process, as will be illustrated further ahead.

The inventors have discovered various methods to manufacture the $H_2O$ composite sorbers consisting of a polymeric matrix and a dissolved hygroscopic inorganic salt; in particular the polymer and the inorganic salt are both dissolved in a solvent, the evaporation of which results in the consolidation of the polymeric matrix that thus contains the dissolved inorganic salt. In a preferred embodiment the polymer and the inorganic salt are dissolved in the same common solvent, but it is also possible to use two different solvents for the polymer and for the hygroscopic inorganic salt, in which case it is necessary that the two solvents are miscible with each other.

In alternative it is possible to directly dissolve the hygroscopic inorganic salt in the polymer precursor, ideally when this is still in the monomer state. Subsequently the polymerization process, for example by thermal treatment or UV irradiation, leads to the formation of the polymeric matrix inside which the hygroscopic inorganic salt is dissolved.

The information on the solubility of polymers and inorganic salts in solvents, the miscibility of different solvents, the solubility of inorganic salts in polymer precursors (their monomers, that in this case act as solvent for the inorganic salt) are widely known and diffused and available to experts in the field and can be found, for example, in publications as the Handbook of Chemistry and Physics, $87^{th}$ edition, 2006-2007, edited by CRC or Alkaline Earth Metal Perchlorates, IUPAC Solubility data Series, Vol. 41, edited by Pergamon Press. Solubility data can be moreover found in other publications, as for example the Handbook of Solubility Parameters and other Cohesion Parameters, $2^{nd}$ edition, 1991, or Hansen Solubility Parameters—A user's Handbook by Charles M. Hansen, $2^{nd}$ edition, 2007 both edited by CRC Press.

Whenever the solubility of a salt in a solvent, a monomer, a polymer or a mixture of at least two of them is not directly available in bibliographic data, an expert in the field can easily obtain it as experimental value. In fact a simple solubility test can consist in subsequent addition of small amount of solute (salt) in a fixed amount of the liquid mixture: starting of precipitate formation correspond to the solubility limit of the salt in the chosen mixture.

Hygroscopic inorganic salts suitable for carrying out the invention are alkaline-metal and alkaline earth-metal perhalogenates, alkaline-metal and alkaline earth-metal halides; the use of perchlorates is preferred.

In the case of composite sorbers that foresee the use of solvents, some examples of polymers and solvents suitable for carrying out the invention are cellulose acetate in methyl acetate, or the same cellulose acetate in tetrahydrofuran cellulose.

In the case in which the solution is composed only of the polymer precursor and of the hygroscopic inorganic salt (the precursor acts as solvent for the inorganic salt) some examples of suitable polymers are polymethylmethacrylate (PMMA), obtained by polymerization of methylmethacrylate (MMA), or polyethylmethacrylate (PEMA) obtained by polymerization of ethyl methacrylate (EMA).

It is also possible to use combinations of polymers or polymer precursors for obtaining the polymeric matrix of the composite sorber being object of the present invention. The case in which one of these polymers or polymeric precursors acts inside the solution as cross-linking agent results to be particularly advantageous. As an example, the use of ethylene glycol dimethylacrylate as cross-linking agent for obtaining a composite sorber having as polymeric matrix PMMA and as hygroscopic inorganic salt dissolved therein magnesium perchlorate results to be particularly advantageous. Moreover particularly advantageous is the combination of a polymeric precursor with a low molecular weight polymer. As an example, the use of mixture of polymethylrnetacrylate (PMMA) with methylmethacrylate (MMA) results to be advantageous whenever the outgassing and shrinkage amount must to be minimized, i.e. if the polymerization has to take place in a closed environment or in a closed device.

Functionalized polymer precursors can moreover be added in order to improve and optimize physiochemical material properties. The adhesion on a selected substrate in fact is very important for the final application of a composite sorber and the use of trimethylsiloxyethyl methacrylate results to be very advantageous to improve the adhesion on a glass-type or a metal-oxidized substrate.

Other additives are usually foreseen in the final composition in order to act as polymerization promoter. Different kinds of polymerization catalysts can be used, as for example cationic, anionic or radical initiator, and it is chosen in function of the polymerization process that will be used to obtain the final matrix. Its concentration is usually lower or equal to 1% w/w.

The quantity of inorganic salt to be added during the manufacturing process of the composite sorber depends on the specific hygroscopic inorganic salt used and on the characteristics of the polymer precursor (in the case in which this acts as solvent for the inorganic salt) or on the solvent-polymer-inorganic salt combinations and is difficult to determine a priori; and it is thus necessary to gradually add quantities of the inorganic salt to dissolve to the solution that will allow to obtain the polymeric composite sorber, proceeding with its dissolution, for example by stirring the solution and observing when the addition of the inorganic salt corresponds to the formation of a precipitate on the bottom of the solution. When this situation is reached this indicates that the addition of further inorganic salt quantities will not increase in any way the concentration of the dissolved inorganic salt, whereby it is possible to proceed to the consolidation of the polymeric matrix, upon eliminating the precipitated inorganic salt, for example by means of filtration.

The use of hygroscopic inorganic salt powders with a particle size larger than 5 µm makes more evident the determination of the limit conditions being reached and simplifies the subsequent operations of removing the excess precipitate.

Obviously it is also possible that the saturation condition of the solution is not reached, in which case the removal operation of the precipitated inorganic salt is not necessary.

In a second aspect thereof the invention consists in a method for the removal of $H_2O$ from devices sensitive to its presence by the use of composite sorbers consisting of hygroscopic inorganic salts dissolved in a polymeric matrix.

Among the sensitive devices that benefit the most from the application of the method of the invention are photovoltaic cells, OLED displays, microelectromechanical devices and lithium batteries.

In general the method of the invention offers advantages when it is necessary that the $H_2O$ concentration inside the sensitive device must not exceed a critical value during the normal functioning of the device. This critical value is related to the kind of sensitive device and among those which require a very low water concentration are the OLEDs, that typically need concentrations in the order of 10 ppm or less, whereas at the extreme opposite there are the solar cells, which can support up to 5000 ppm before irreversible deterioration phenomena are triggered.

The polymer containing the dissolved hygroscopic inorganic salt may be used in form of an already consolidated film, in this case with thicknesses typically between 10 µm and 200 µm, or it may be used when not yet completely solidified, while carrying out the final phase of consolidation or polymerisation once it has been dispensed: in this case the use of the monomer as medium in which the hygroscopic inorganic salt is dissolved results to be particularly advantageous for this way of use, because there is no evaporation of the solvent that could give rise to contaminations of the device. The dispensing on the final support may be carried out by various methods widely known in the field, for example through brush work or spraying; preferred is the use of serigraphic method, well known in the printing field, which allows a better control of the deposit thickness (by means of control of the stencil thickness, through which the mixture is forced to pass for reaching the support) or also a filmograph may be used (a plate held at a fixed distance from a base or support, at a distance that corresponds to the thickness of the film).

Another way of using the sorbers made according to the present invention foresees the melting of the polymer containing the dissolved hygroscopic inorganic salt; in this case it is useful to obtain the $H_2O$ sorber from a thermoplastic polymer, i.e. from a polymeric material with a melting temperature typically lower than 300° C.

Another embodiment foresees the use of $H_2O$ sorbers made according to the present invention in the form of nanofibres, that can be produced by a technique known in the field by the term "electrospinning".

In some devices it may be useful to fill the inner volume of the sensitive device with the composite sorber; in this case the preferred solution foresees the introduction of the composite sorber in already consolidated form. A subsequent thermal treatment causes then the melting thereof and consequent filling of the inner volume of the device in a nearly uniform manner. Among the sensitive devices that benefit the most of this particular configuration are the photovoltaic cells and the OLED displays.

In a third aspect thereof the invention is inherent to composite sorbers consisting of polymeric matrices comprising dissolved hygroscopic inorganic salts that could be chosen from one or more of the following inorganic compounds: alkaline-metal and alkaline earth-metal perhalogenates, alkaline-metal and alkaline earth-metal halides, among which the use of perchlorates results to be preferred.

The invention will be further described with reference to the following examples:

EXAMPLE 1

A film of a polymeric composite sorber according to the present invention is produced by dissolving a hygroscopic inorganic salt in a monomer. A quantity of 0.4 grams of magnesium perchlorate is used, the powder's particle size of which is not controlled and may also comprise flakes of a diameter of 2 mm. The inorganic salt is dissolved in 5 grams of methylmetacrylate (MMA) and 0.05 grams of benzoin methyl ether, this last one having the function of polymerisation initiator.

The polymerisation is carried out inside a chamber model UVACUBE 100 produced by Honle, and obtained by means of irradiation with ultraviolet light produced by a 100 W mercury lamp. In the following example, the solution is subjected to a "pre-UV curing" treatment for 14 minutes with a radiation dose equal to 4.35 $J/cm^2$.

The pre-polymerised solution is spread out by means of a filmograph with a thickness of 50 microns on a steel plate and finally consolidated by means of a "post-UV curing" treatment for 30 minutes (the corresponding radiation dose being 932 $J/cm^2$). All of the preceding operations are carried out in a glove box under an inert gas flux in order not to compromise the sorbing capacity of the hygroscopic inorganic salt.

The photography by optical microscopy is shown in FIG. 1.

EXAMPLE 2 (COMPARATIVE)

A film of a polymeric composite sorber is produced by not operating under the conditions of the invention i.e. using a common solvent, dichloromethane ($CH_2Cl_2$), for the polymer (PMMA) and the inorganic salt ($Mg(ClO_4)_2$), in which the solvent is not able of dissolving the inorganic salt.

The quantities of polymer and inorganic salt are the same as in example 1, also the particle size of the inorganic salt is the same, whereas as regards the quantity of the solvent, a quantity equal to 15 g has been used.

Figure 2:
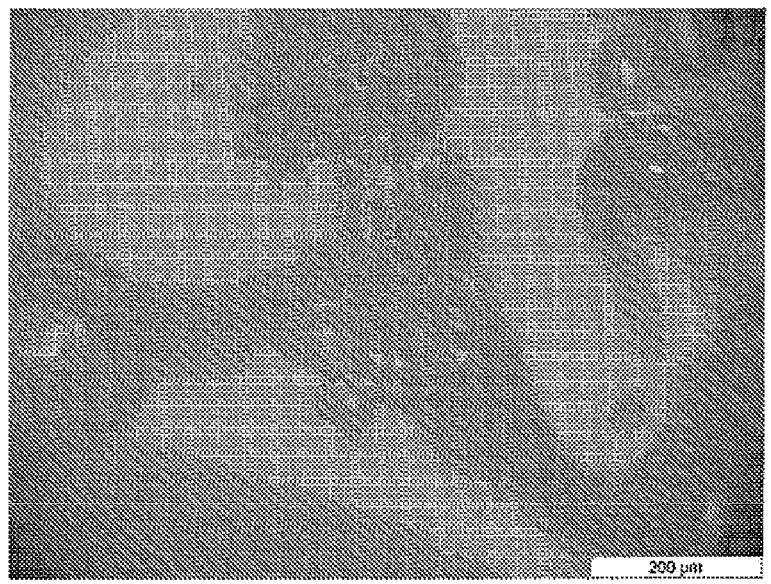
FIG. 2 shows a photography taken by an optical microscope of a composite sorber made with one of the inorganic salts suitable for carrying out the present invention, but not with the method herein described.

The photography by optical microscopy is shown in FIG. 2.

EXAMPLE 3 (COMPARATIVE)

A film of a polymeric composite sorber is produced by operating as in example 1, i.e. using a solution given by the monomer (MMA) mixed with powders of hygroscopic material, but using a hygroscopic material not foreseen by the present invention, i.e. calcium oxide in powder form, added in a quantity equal to 0.4 g, that does not dissolve in methylmethacrylate.

Figure 3:
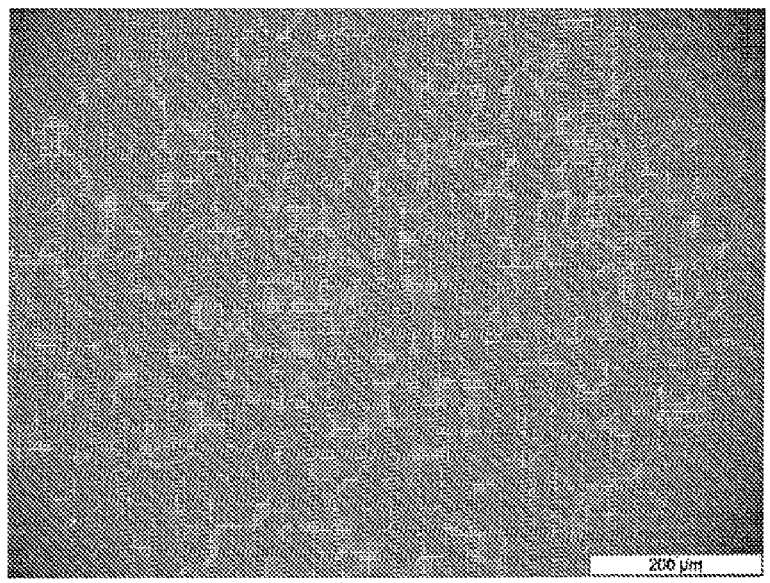
FIG. 3 shows a photography taken by an optical microscope of a composite sorber made with a non-suitable material.

The photography by optical microscopy is shown in FIG. 3.

EXAMPLE 4

This example compares a secondary characteristic, the transparency, of the films from polymeric composite sorbers obtainable with some special polymers (among which PMMA) prepared as described in the examples 1-3.

For this characterisation a double beam spectrophotometer Jasco V 570 has been used, with a single monochromator, a Hamamatsu detector, using deuterium and halogen lamp, scanning velocity 1000 nm/min, passband 1 nm and 0.3 nm accuracy. The characterised area of each polymeric film corresponds to the area of the incident light beam on the sample, i.e. a rectangle of 1×10 $mm^2$.

Figure 4A:
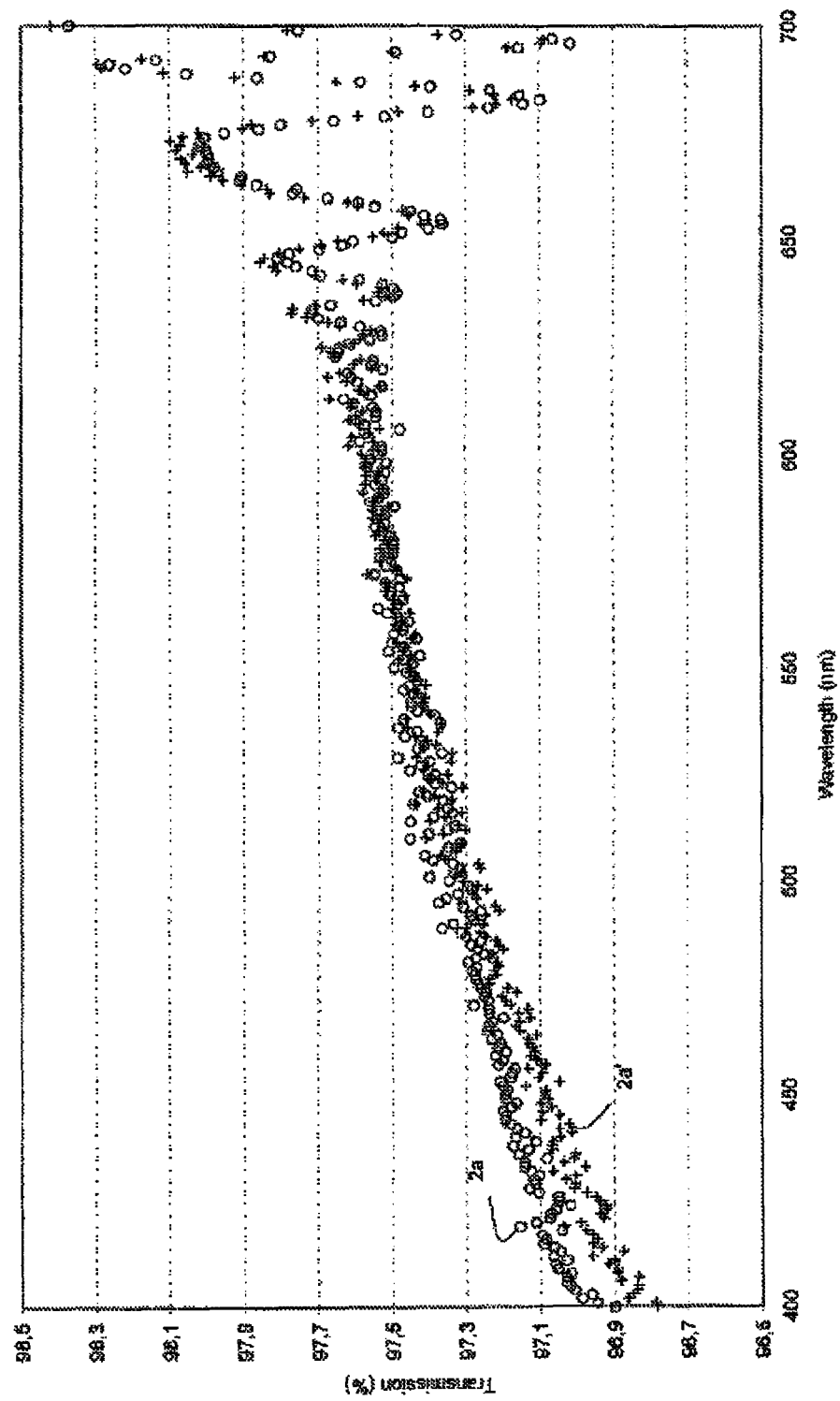
FIG. 4A shows the comparison between the transparency of a film, made according to the method of the invention, at time zero and of the same film after 23 hours of exposure to air.

The results related to the spectral interval 400-700 nm are shown in the FIGS. 4 and 4A in which:
curve 1 shows the transmission curve of a PMMA film without any hygroscopic inorganic salt;
the curves 2 and 2' show the transmission curves of a film prepared according to what described in example 1, respectively at time 0 and after 23 hours of exposure to air. In order to distinguish the two curves, which result to be almost perfectly superimposed, circles have been use to show the points for the test at time 0, whereas crosses have been used for the test after 23 hours; and
curve 3 shows the transmission curve of a film prepared according to what described in example 2, i.e. a PMMA film comprising not perfectly dissolved magnesium perchlorate salts.

In FIG. 4A the comparison between the transparency curve at time 0 (curve 2a) and after 23 hours of exposure to air, (curve 2a'), is shown, using a very expanded scale for the axis of ordinates in order to appreciate the differences between these curves.

It was not possible to add a curve relating to the transparency of a sample prepared according to example 3, because this already at first sight resulted opaque.

FIGS. 1-3 highlight how only in the case of FIG. 1 there are no particles or their aggregates in the polymeric composite sorber film, as instead happens in the case of FIG. 2, in which there is not perfectly dissolved magnesium perchlorate in the film which gives rise to a film with irregular characteristics, whereas FIG. 3 shows the calcium oxide particles enclosed in the polymeric film.

FIG. 4 allows to observe how the morphological differences in the polymeric composite sorber film can transform also in phenomenological differences, referring particularly to a secondary characteristic of the hygroscopic film, i.e. its transparency. This secondary characteristic is very useful in the case the sensitive device is an OLED display or placed in a solar cell.

In fact it can be observed how a hygroscopic film produced according to the present invention shows a transparency (lines 2, 2') that is totally comparable to that of a polymer without inorganic salt (line 1). Further the characteristic of transparency of the hygroscopic film is not compromised by the $H_2O$ sorbing of the active component contained therein, i.e. the hygroscopic inorganic salt, and results to be always greater than 95% in the spectral interval considered.

FIG. 4A shows how there are no significant differences in the transmission curve of a composite sorber obtained according to the method of the invention at time zero (curve 2a) and after 23 ours of exposition to air (curve 2a').

Instead a film containing a hygroscopic inorganic salt not perfectly dissolved in the polymeric matrix, apart from showing in general definitely inferior transmission characteristics (curve 3) with respect to the films of the present invention, has also a high variability of its transparency characteristics according to the considered sample zone of the film.

The situation is still more critical if an active component is chosen to be added to the polymeric matrix that is not among those described in the present application, as in the case of calcium oxide, that results to give rise to an opaque hygroscopic film and for which it was not even possible to perform the characterisation.

The invention claimed is:

1. A method for the removal of $H_2O$ from a device sensitive to its presence comprising steps of
   providing a composite sorber comprising a hygroscopic inorganic salt dissolved in a polymeric matrix, wherein said hygroscopic inorganic salt is chosen from the group of alkali-metal and alkaline earth-metal perhalogenates, alkali-metal hydroxides, alkali-metal and alkaline earth-metal halides and their combination, wherein said polymeric matrix is polymerized from a mixture comprising two polymer precursors or a mixture of a polymer and a polymer precursor, in which one of said polymer precursors acts as cross-linking agent for the polymeric matrix; and
   contacting the device with the composite sorber to remove $H_2O$ from the device.

2. The method according to claim 1, in which said sensitive device is an OLED display.

3. The method according to claim 1, in which said sensitive device is a microelectromechanical device.

4. The method according to claim 1, in which said sensitive device is a solar cell.

5. The method according to claim 1, in which said sensitive device is a lithium battery.

6. The method according to claim 1, in which said composite sorber is used in form of a thin film with a thickness between 10 and 200 µm.

7. The method according to claim 1, in which said composite sorber is dispensed inside of said sensitive device before the final step of consolidation of said sorber.

8. The method according to claim 7, in which said dispensation occurs by serigraphy.

9. The method according to claim 7, in which the final step of consolidation is a thermal or UV-promoted polymerization.

10. The method according to claim 1, in which said polymeric composite sorber has the form of nanofibres.

11. The method according to claim 10, in which said nanofibres are manufactured by the technique of electrospinning.

12. The method according to claim 1, in which said sorber is introduced in said sensitive device by melting of said composite sorber.

13. A method comprising
   providing a device sensitive to $H_2O$;
   providing a composite sorber, wherein the composite sorber comprises a hygroscopic inorganic salt dissolved in a polymeric matrix, wherein said hygroscopic inorganic salt is chosen from the group of alkali-metal and alkaline earth-metal perhalogenates, alkali-metal hydroxides, alkali-metal and alkaline earth-metal halides and their combination, wherein said polymeric matrix is polymerized from a mixture comprising two different polymers, or a mixture of a polymer and a polymer precursor monomer, in which one of said polymers acts as cross-linking agent for the polymeric matrix; and
   contacting the device with the composite sorber to remove the $H_2O$ from the device.

* * * * *